(12) United States Patent
Zhang et al.

(10) Patent No.: US 10,134,479 B2
(45) Date of Patent: Nov. 20, 2018

(54) NON-VOLATILE MEMORY WITH REDUCED PROGRAM SPEED VARIATION

(71) Applicant: SANDISK TECHNOLOGIES LLC, Plano, TX (US)

(72) Inventors: Zhengyi Zhang, San Jose, CA (US); Yingda Dong, Los Altos, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/494,085

(22) Filed: Apr. 21, 2017

(65) Prior Publication Data
US 2018/0308555 A1 Oct. 25, 2018

(51) Int. Cl.
*G11C 16/34* (2006.01)
*G11C 16/16* (2006.01)
*G11C 16/26* (2006.01)
*G11C 16/08* (2006.01)

(52) U.S. Cl.
CPC .......... *G11C 16/3427* (2013.01); *G11C 16/08* (2013.01); *G11C 16/16* (2013.01); *G11C 16/26* (2013.01); *G11C 16/3459* (2013.01)

(58) Field of Classification Search
CPC ..... G11C 16/3427; G11C 16/08; G11C 16/16; G11C 16/26; G11C 16/3459
USPC .................................. 365/185.01–185.33
See application file for complete search history.

(56) References Cited

U.S. PATENT DOCUMENTS

| | | | |
|---|---|---|---|
| 6,888,758 B1 | 5/2005 | Hemink | |
| 6,917,542 B2 | 7/2005 | Chen | |
| 7,120,051 B2* | 10/2006 | Gorobets | G11C 11/5628 |
| | | | 365/185.02 |
| 7,301,805 B2* | 11/2007 | Gorobets | G11C 11/5628 |
| | | | 365/185.02 |
| 7,440,331 B2 | 10/2008 | Hemink | |
| 7,794,921 B2 | 9/2010 | Chen | |
| 8,310,870 B2 | 11/2012 | Dutta | |
| 8,456,911 B2 | 6/2013 | Yuan | |
| 8,692,314 B2 | 4/2014 | Lee | |
| 8,902,661 B1 | 12/2014 | Raghu | |
| 8,982,626 B2 | 3/2015 | Dong | |
| 9,343,156 B1 | 5/2016 | Mui | |
| 2005/0083735 A1 | 4/2005 | Chen | |
| 2009/0230449 A1 | 9/2009 | Sakaguchi | |
| 2011/0199833 A1 | 8/2011 | Shim | |
| 2013/0028027 A1 | 1/2013 | Kim | |
| 2014/0056069 A1 | 2/2014 | Park | |
| 2014/0362645 A1 | 12/2014 | Dong | |
| 2015/0070986 A1 | 3/2015 | Hirai | |
| 2016/0071870 A1 | 3/2016 | Minami | |
| 2016/0118131 A1* | 4/2016 | Dong | G11C 16/3427 |
| | | | 365/185.02 |

OTHER PUBLICATIONS

Pang, et al., U.S. Appl. No. 15/175,304, entitled "Memory Hole Size Variation In A 3D Stacked Memory," filed Jun. 7, 2016.
(Continued)

*Primary Examiner* — Harry W Byrne
(74) *Attorney, Agent, or Firm* — Vierra Magen Marcus LLP

(57) ABSTRACT

A memory system is configured to program different memory cells to different final targets for a common data state based on distance to one or more edges of a word line layer.

9 Claims, 19 Drawing Sheets

(56) References Cited

OTHER PUBLICATIONS

Zhang, et al., U.S. Appl. No. 15/437,718, entitled "Grouping Memory Cells into Sub-blocks for Program Speed Uniformity," filed Feb. 21, 2017.
PCT International Search Report dated May 4, 2018, PCT Patent Application No. PCT/US2018/020167.
PCT Written Opinion of the International Searching Authority dated May 4, 2018, PCT Patent Application No. PCT/US2018/020167.

\* cited by examiner

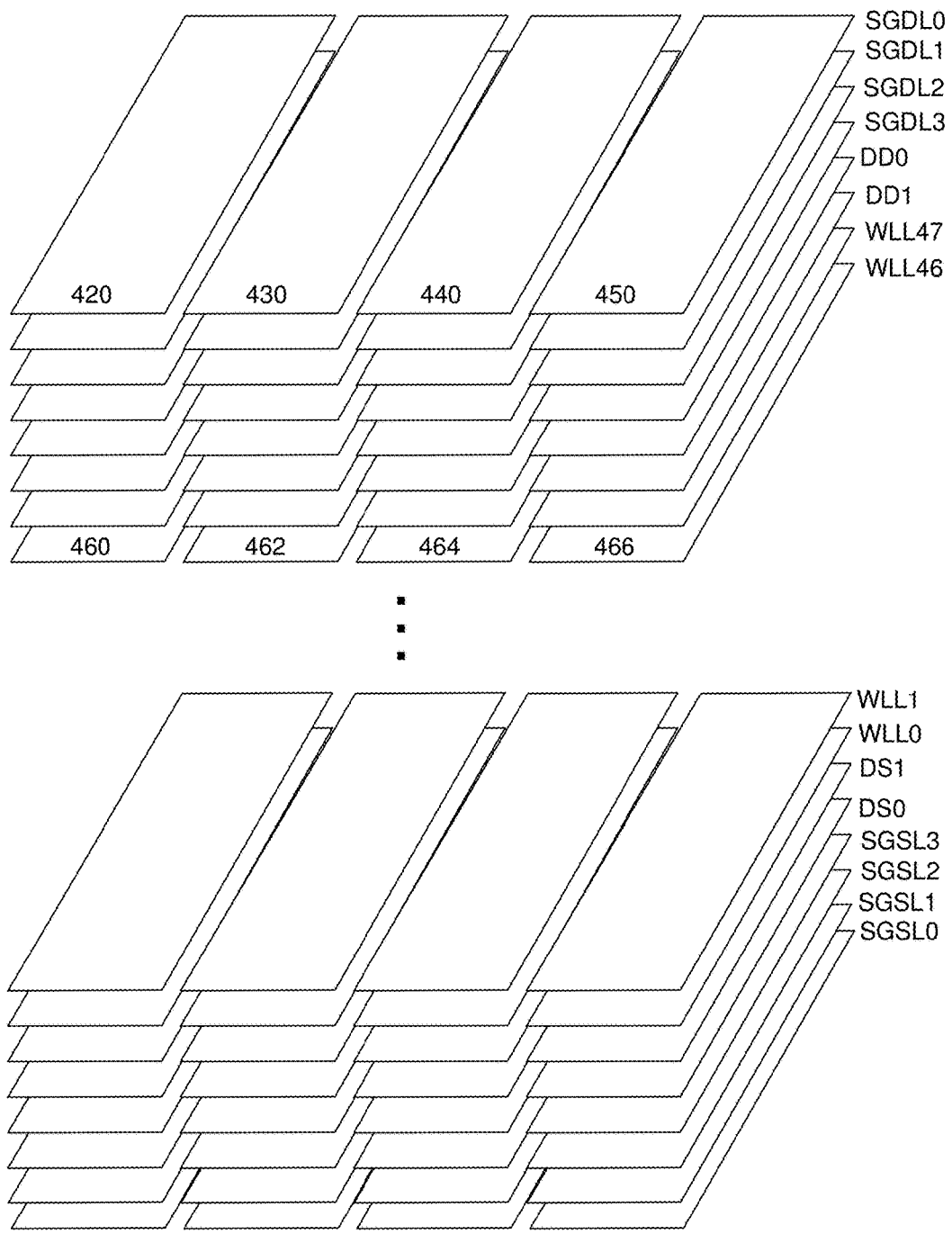

Figure 5
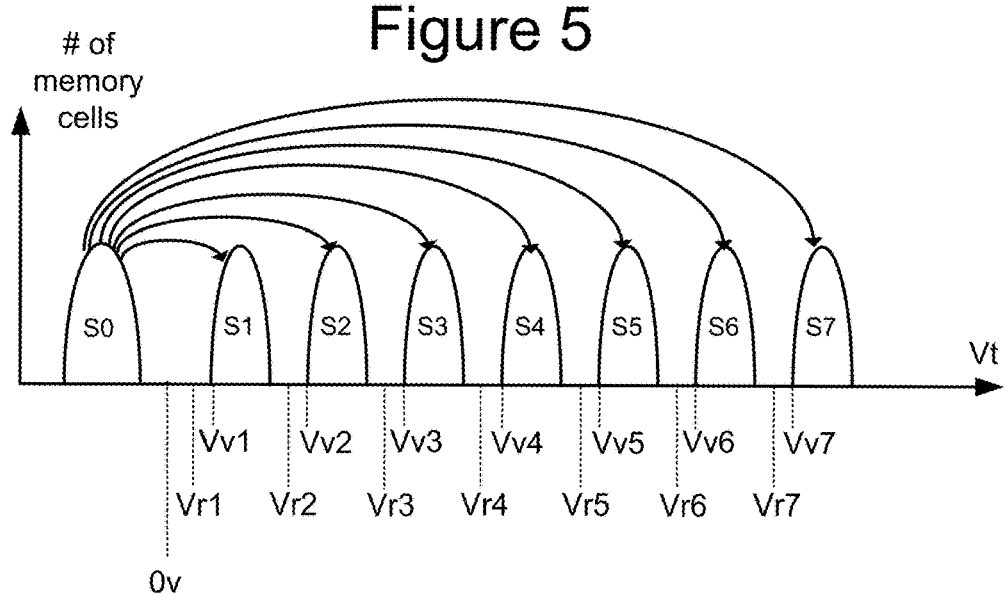
Figure 6
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
Figure 7C
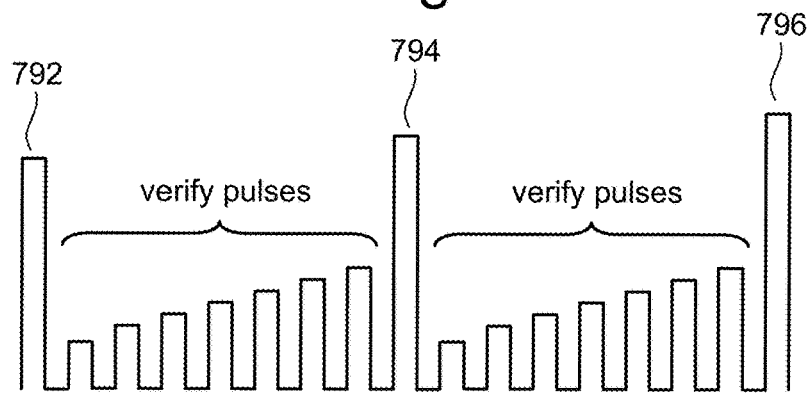

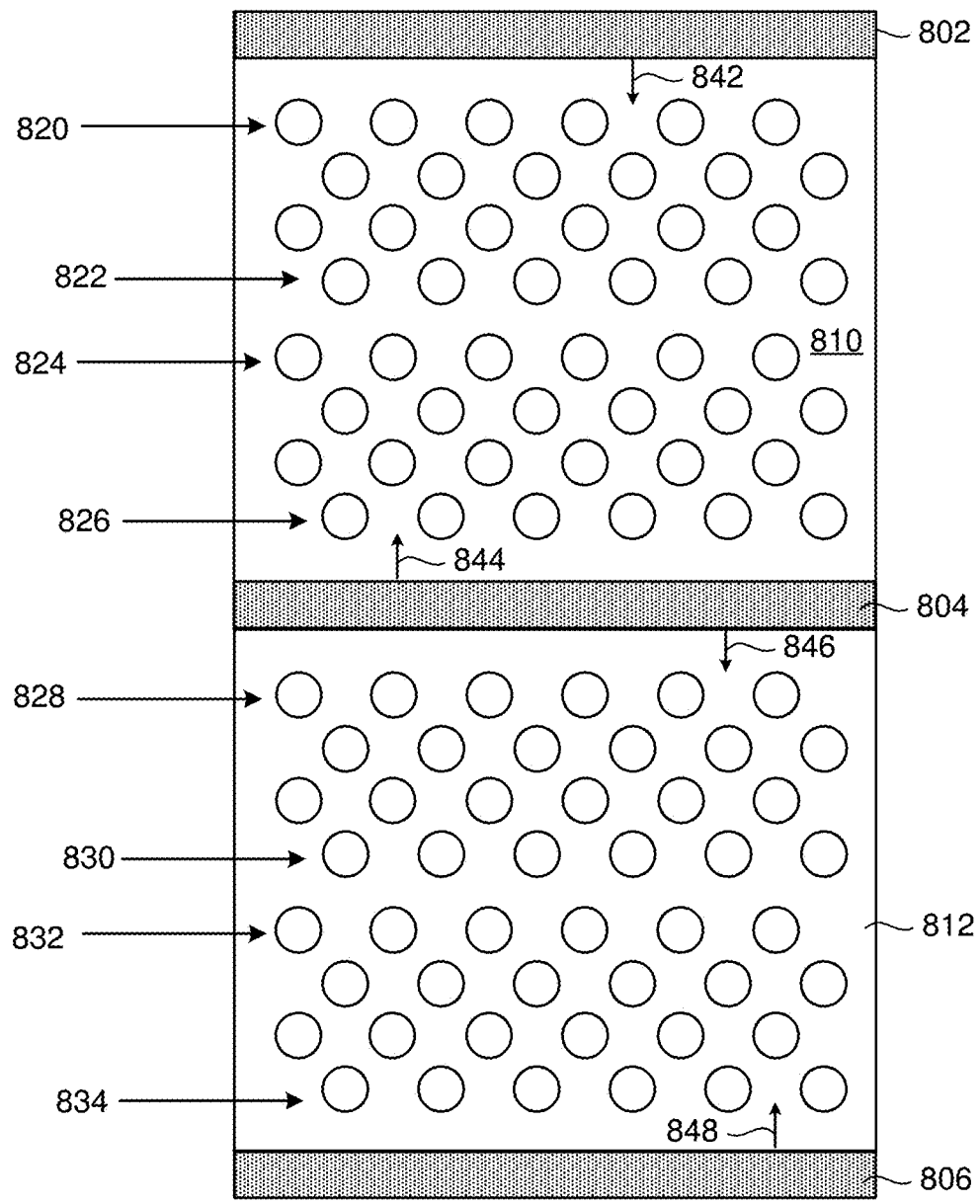

NON-VOLATILE MEMORY WITH REDUCED PROGRAM SPEED VARIATION

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

As memory structures increase in density, it becomes more challenging to maintain the integrity of the data being stored.

BRIEF DESCRIPTION OF THE DRAWINGS

Like-numbered elements refer to common components in the different figures.

FIG. 4D depicts a view of the select gate layers and word line layers.

FIG. 5 depicts threshold voltage distributions.

FIG. 6 is a table describing one example of an assignment of data values to data states.

FIG. 7C depicts a word line voltage during programming and verify operations.

FIG. 8 depicts a top view of a portion of a block of memory cells.

DETAILED DESCRIPTION

In order to reduce errors, a memory system is proposed that programs different memory cells to different final targets for a common data state based on distance to one or more edges of a word line layer. For example, a plurality of non-volatile memory cells include a first group of memory cells at a first range of one or more distances from to one or more edges of the word line layer and a second group of memory cells at a second range of one or more distances from to one or more edges of the word line layer. The second range of distances are greater than the first range of distances. A control circuit is configured to program the first group of memory cells using a first target level for a first data state and program the second group of memory cells using a second target level for the first data state. The first target level is higher in voltage than the second target level such that on completion of programming the first group of memory cells are in a first threshold voltage distribution and the second group of memory cells are in a second threshold voltage distribution that is lower in voltage than the first threshold voltage distribution. The above example mentioned a first target level and a second target level, both for a first data state. Other embodiments can use a first set of target levels and a second set of target level, both for a set of data states, where the first set of target levels are higher in voltage than corresponding target levels of the second set of target levels.

Figure 1:
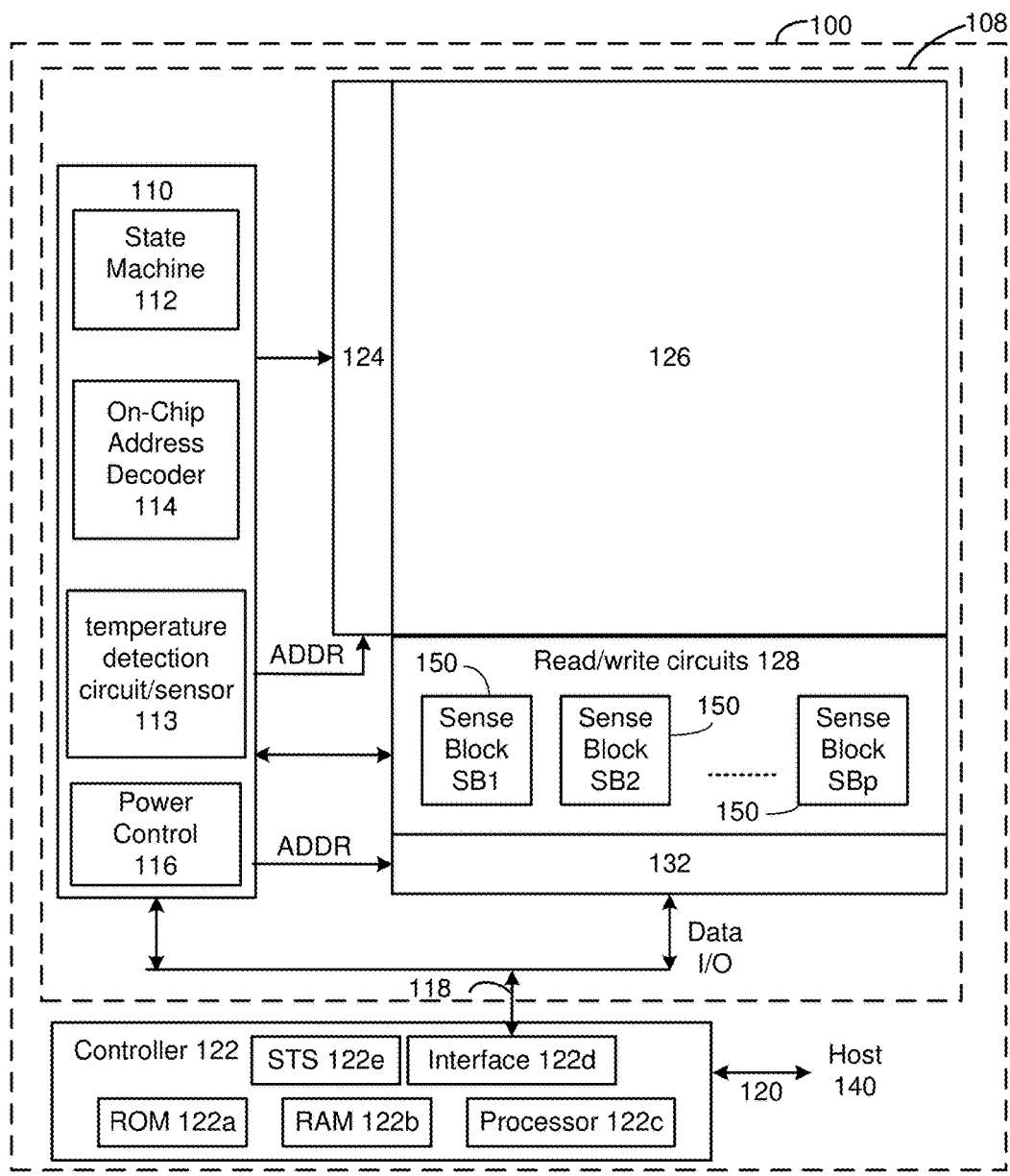
FIG. 1 is a functional block diagram of a memory device.

FIGS. 1-4F describe one set of examples of a memory system that can be used to implement the technology proposed herein. FIG. 1 is a functional block diagram of an example memory device. The components depicted in FIG. 1 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells (connected to the same word line) to be read or programmed in parallel. In some systems, a controller 122 is included in the same memory device 100 as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. The state machine 112 provides die-level control of memory operations, such as programming different memory cells to different final targets for a common data state based on distance to an edge of a word line layer. Temperature detection circuit 113 (which is an example of a memory temperature sensor on memory die 108) is configured to detect temperature at the memory die 108, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and/or controller 122 can be considered a control circuit that performs the functions described herein.

The (on-chip or off-chip) controller 122 (which in one embodiment is an electrical circuit) may comprise one or more processors 122c, ROM 122a, RAM 122b, Memory Interface 122d and a system temperature sensor 122e, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described below related to programming different memory cells to different final targets for a common data state based on distance to an edge of a word line layer. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
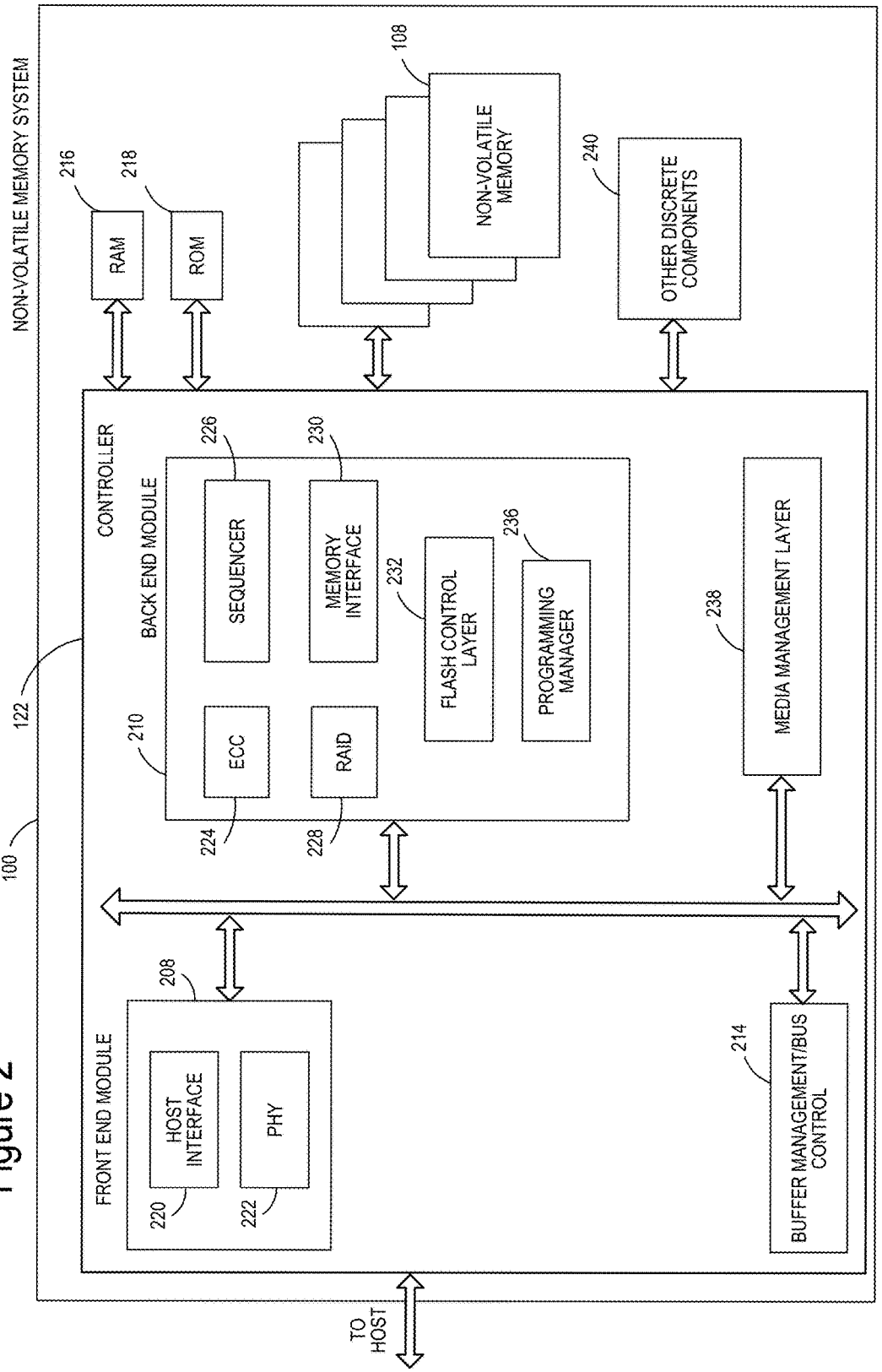
FIG. 2 is a block diagram depicting one embodiment of a memory system.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

Figure 3:
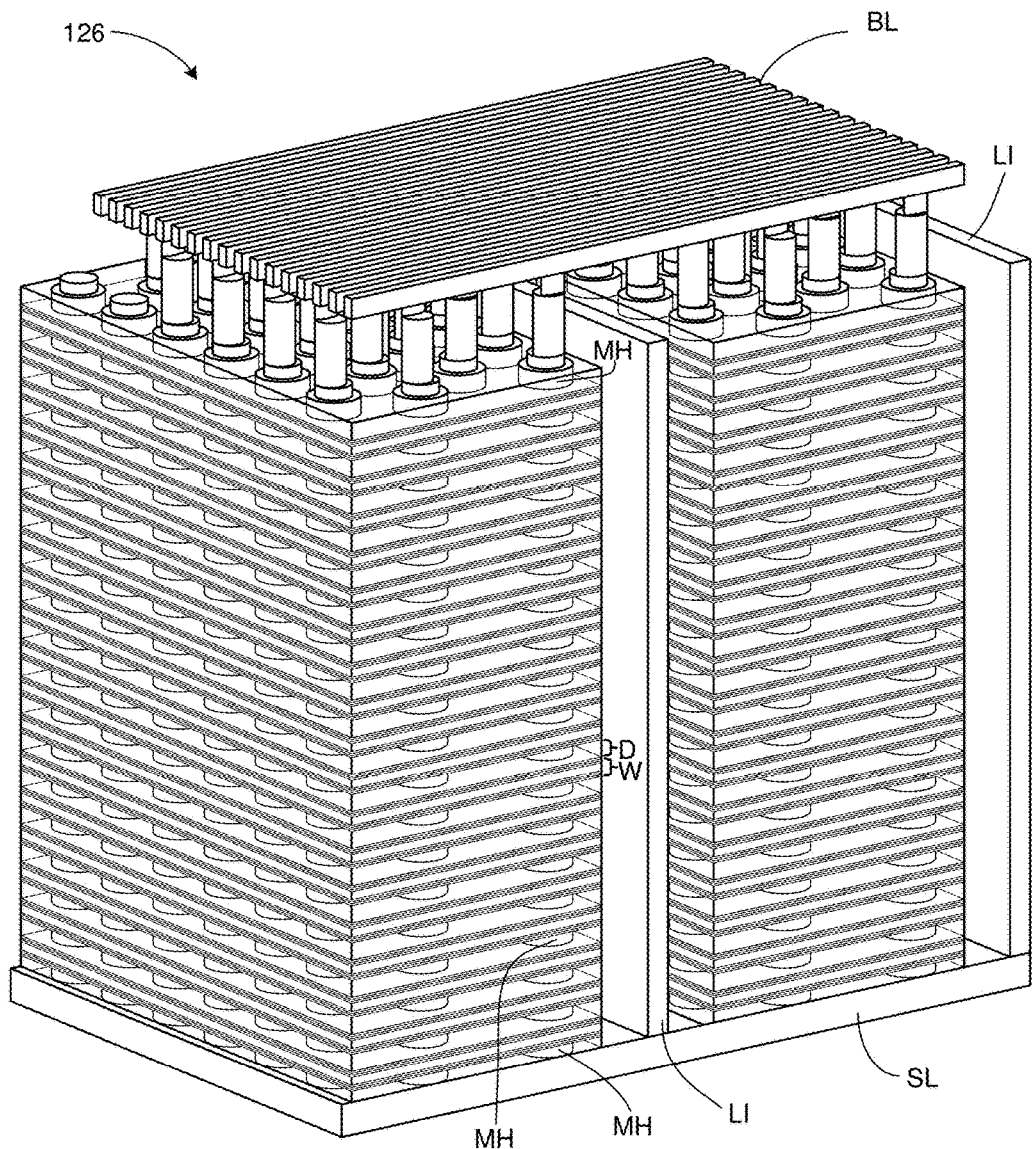
FIG. 3 is a perspective view of a portion of one embodiment of a monolithic three dimensional memory structure.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a programming manager 236, which can be used to manage (in conjunction with the circuits on the memory die) the programming of memory cells closer to an edge of the word line layer and memory cells further from the edge of the word line layer to a first data state representing first data such that the memory cells closer to the edge of the word line layer are programmed to a first final threshold voltage distribution using a first final verify level and the memory cells further from the edge of the word line layer are programmed to a second final threshold voltage distribution using a second verify level, where the second verify level is lower than the first verify level and the second final threshold voltage distribution is lower in voltage than the first threshold voltage distribution. For example, in one embodiment, programming manager 236 may perform and/or manage the processes of FIGS. 7A, 12, 14 and 15, described below. More details of programming manager 236 are also provided below with respect to those figures. Programming manager 236 can be an electrical circuit, a set of one or more software modules, or a combination of a circuit and software.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a perspective view of a portion of one example embodiment of a monolithic three dimensional memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

Figure 4A:
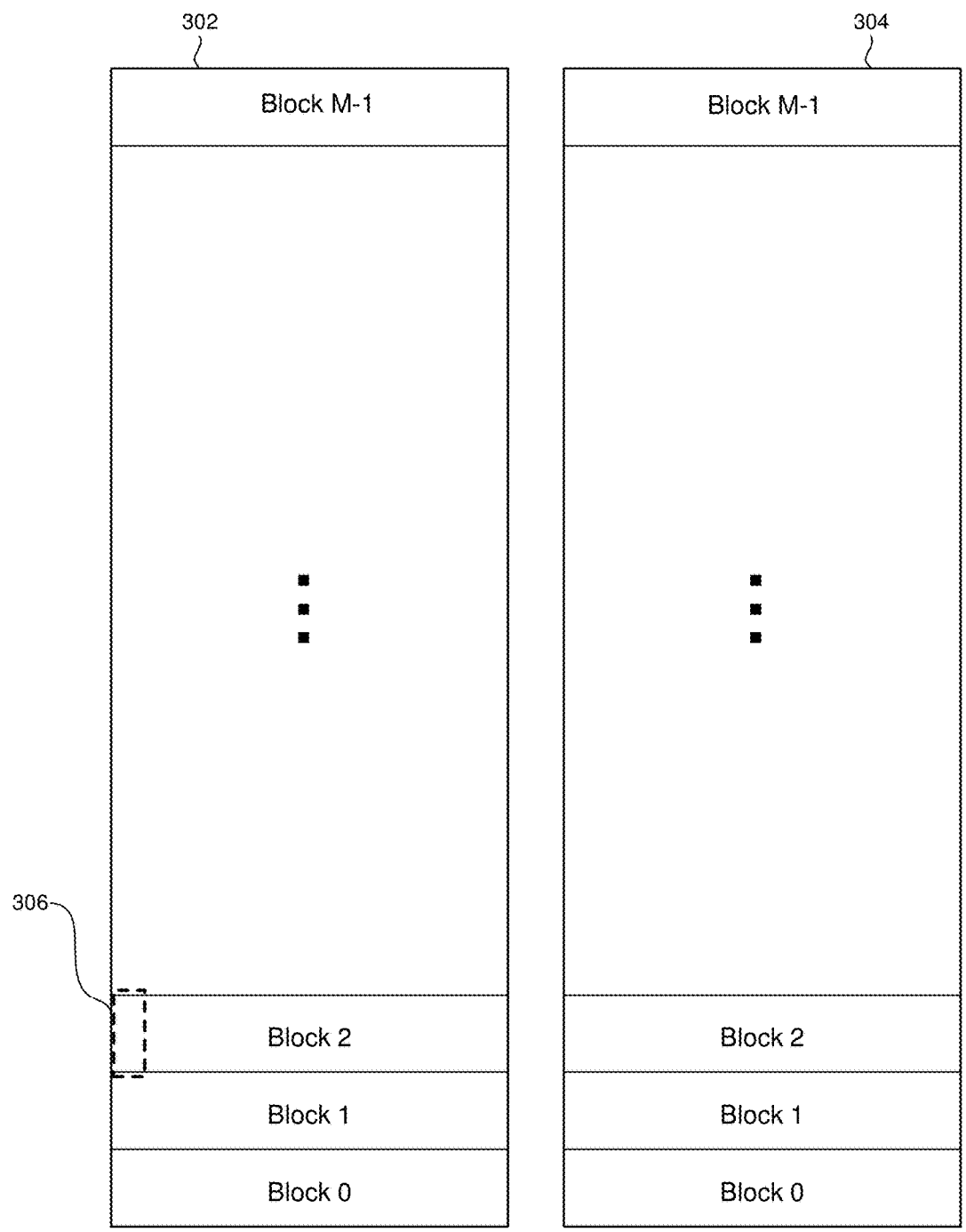
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, ... and plane 304 includes blocks 1, 3, 5, 7, .... In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
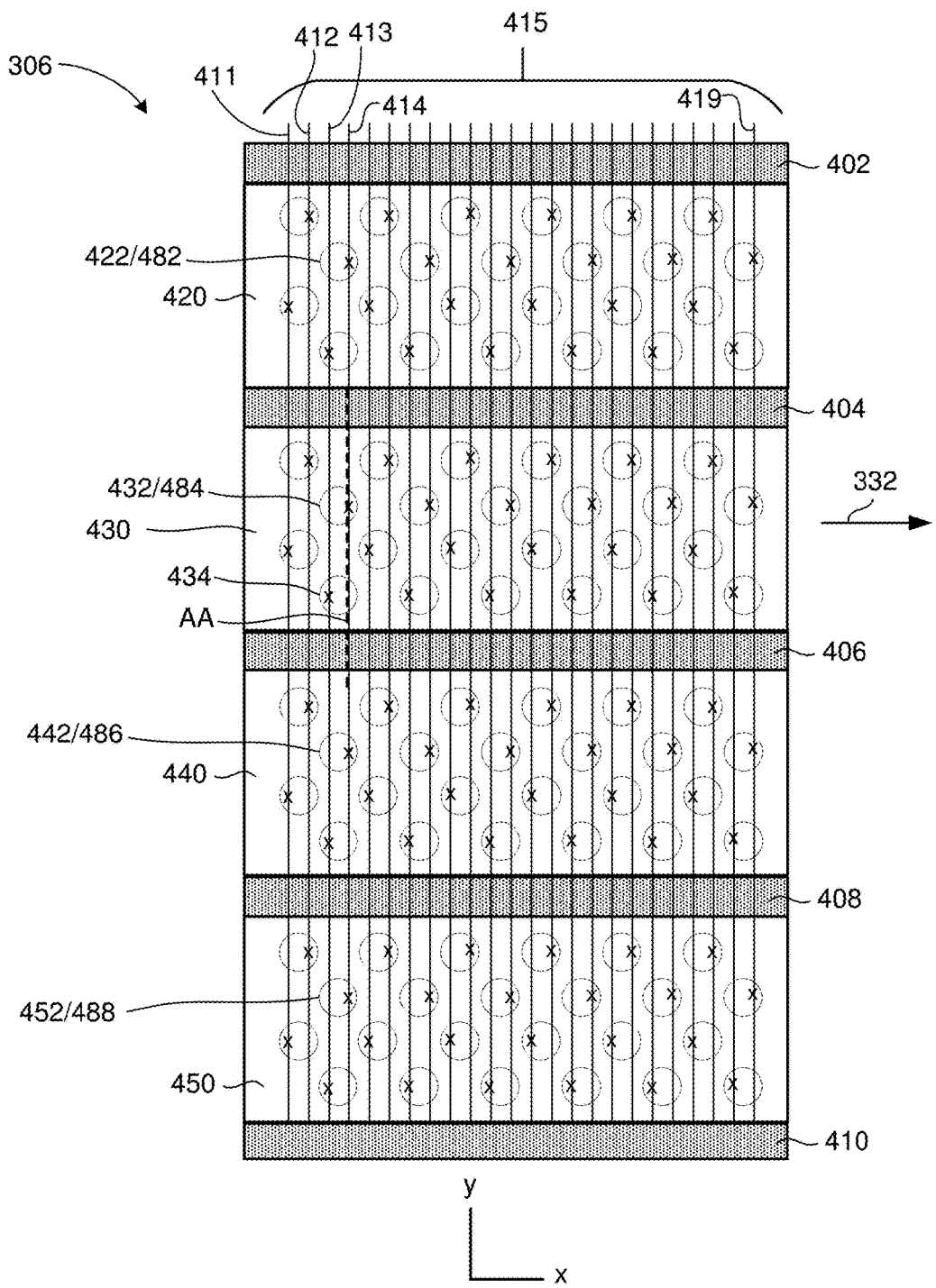
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string and, therefore, can be referred to as a memory column. A memory column can implement other types of memory in addition to NAND. FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation areas 402, 404, 406, 408 and 410 that serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns In one embodiment, isolation areas 402, 404, 406, 408 and 410 are filled with a layer of $SiO_2$ (blocking) and a layer of poly-silicon (source line connection).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
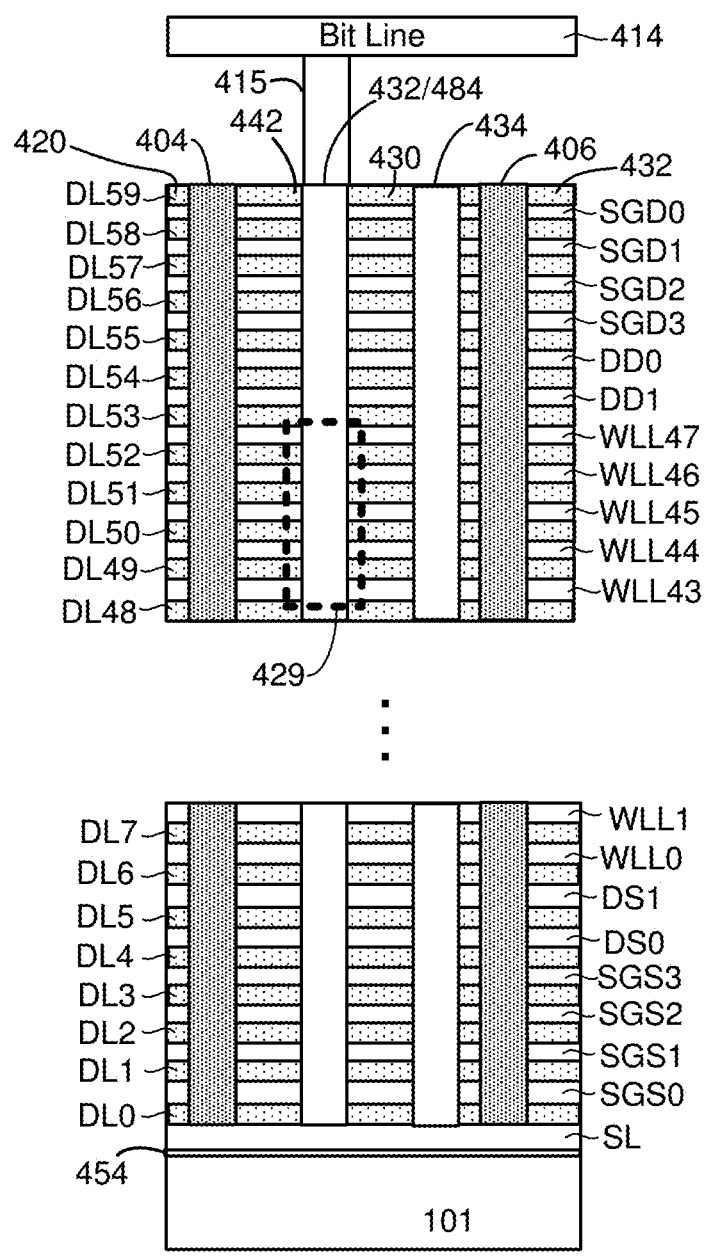
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Isolation areas 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment isolation areas 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
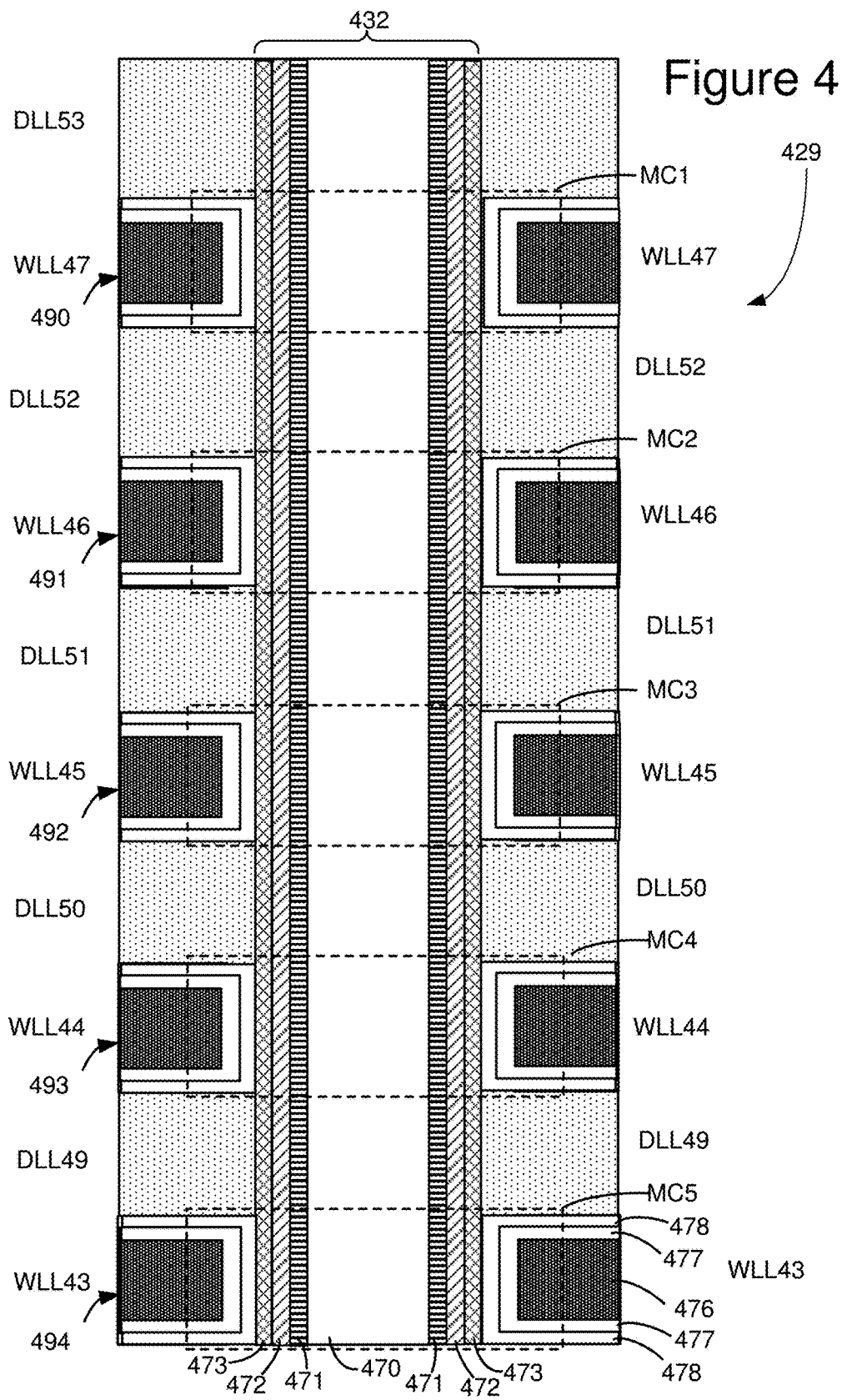
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO$_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
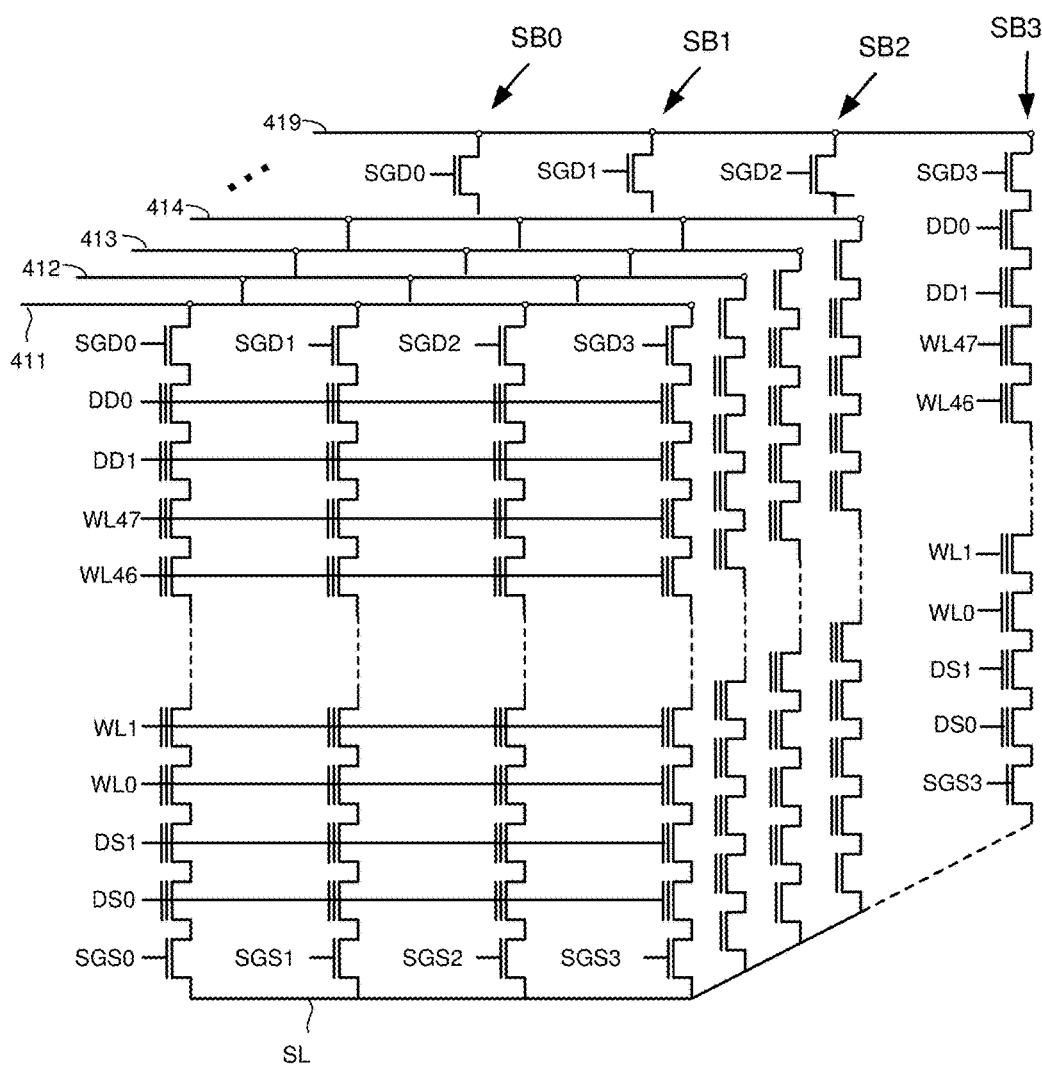
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 is a table describing one example of an assignment of data values to data states. In the table of FIG. 6, S0—111. S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

Figure 7A:
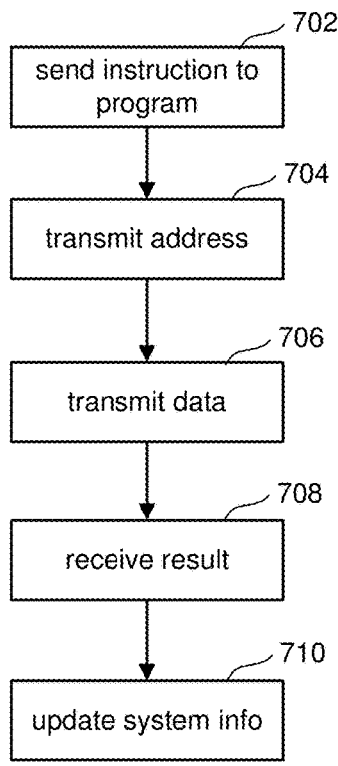
FIG. 7A is a flow chart describing one embodiment of a process for programming.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
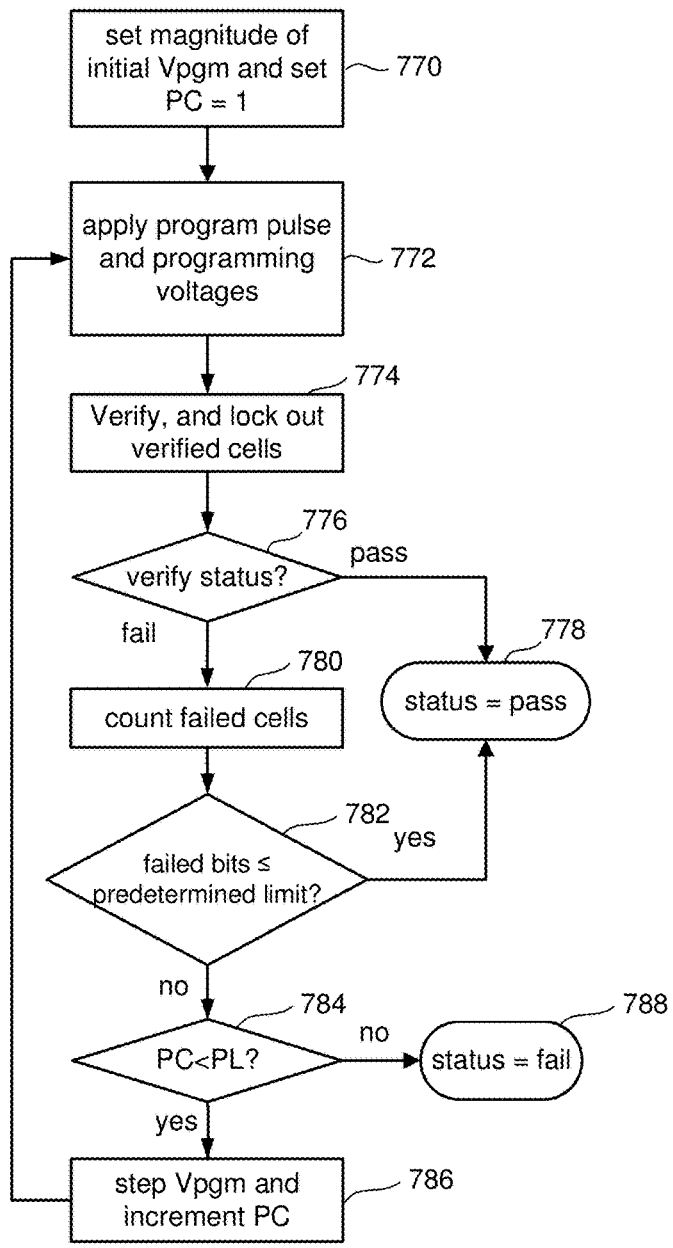
FIG. 7B is a flow chart describing one embodiment of a process for programming data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Looking back at FIG. 4B, the memory structure is depicted with four rows of memory holes between isolation areas 402, 404, 406, 408 and 410. In some embodiments, when memory cells are further scaled down, one approach is to reduce the number of isolation areas which are used to separate sub-blocks or increase the number of memory holes without increasing the number of isolation areas. The isolation areas are also used to let in etchant to etch away silicon nitride (SiN) layers inside the multiple oxide/nitride layer stack and replace them with tungsten layers which will be used as word line layers. That is when the memory stack is first fabricated, alternating layers of dielectric material (oxide) and silicon nitride are deposited or otherwise laid down. Then the memory holes are created through the alternating layers of oxide/nitride. Various materials that make up the memory holes are then added, as depicted in FIG. 4E. Then the isolation areas are carved into the stack. Subsequently, an etchant is inserted via the insolation areas in order to etch out the silicon nitride. Once the silicon nitride is removed, tungsten is used to replace the silicon nitride. This tungsten will become the word line layers.

If the number of isolation areas is reduced as compared t the number of memory holds, it means more memory holes will exist between every two neighboring isolation areas. This also means larger areas of silicon nitride need to be etched away and replaced by tungsten between every two neighboring isolation areas and, therefore, the silicon nitride etching process will take a longer time. Since the silicon nitride layers surrounding the outer memory holes (memory holes which are closer to the isolation areas) will be etched earlier by the etchant (typically hot phosphoric acid) coming in from vertically etched through isolation areas, while the silicon nitride layers surrounding the inner memory holes (memory holes which are closer to the isolation areas) will be etched later, the dielectric layers (SiO$_2$ layers) inside the outer memory holes will be exposed to the etchant for a longer time. Due to this exposure difference, the SiO$_2$ layers of the outer memory holes will be etched away more than that of the inner memory holes. This will cause thinner dielectric layer thickness inside the outer memory holes which leads to faster memory cell programming and erasing. It will also lead to comparatively thicker dielectric layer thickness for the inner memory holes which leads to slower memory programming and erase speeds.

FIG. 8 shows a portion of a block which includes isolation areas 802, 804 and 806. Between neighboring isolation areas are eight rows of memory holes. For example, between isolation area 802 and isolation area 804 is word line finger 810 having eight rows of memory holes. Row of memory holes 820 and row of memory holes 826 are outer memory holes. Row of memory holes 822 and row of memory holes 824 are inner memory holes. Arrows 842 and 844 depict the direction of the etchant discussed above as it moves from its respective isolation area (802 and 804) toward the inner memory holes of rows 822 and 824. As discussed above, the memory holes of rows 820 and 826 will be etched earlier and longer. Therefore, dielectric layers of the memory holes of rows 820 and 826 will be thinner than the dielectric areas of rows of memory holes 822 and 824. For example, blocking dielectric 478 (see FIG. 4E) will be thinner for the memory cells of memory holes in rows 820 and 826, as compared to the memory cells of memory holes in rows 822 and 824. In some cases, the inner word line dielectric layers (e.g., DL0, DL1, DL2, . . . ) will also be thinner.

Because of the thinner blocking dielectrics, memory cells of rows 820 and 826 will be faster programming memory cells. Due to the thicker blocking dielectrics, the memory cells of rows 822 and 824 will be slower programming memory cells. A faster programming memory cell is a memory cell that changes threshold voltage faster than a slower memory cell under the same programming conditions. Conversely, a slower memory cell is a memory cell that changes its threshold voltage slower than a faster memory cell under the same programming conditions.

FIG. 8 also shows word line finger 812 between isolation area 804 and isolation area 806. Word line finger 812 includes eight rows of memory holes including outer memory holes of rows 828 and 834 and inner memory holes of rows 830 and 832. Arrows 846 and 848 show the direction of the etchant from the isolation areas into the inner memory holes. As discussed above, the memory cells in the outer memory holes will have thinner blocking dielectrics than inner memory holes, therefore, the memory cells in the outer memory holes of rows 828 and 834 will be faster programming memory cells while the memory cells of inner memory holes of rows 830 and 832 will have thicker blocking dielectrics and be slower programming memory cells.

Memory holes (also known an memory columns) can be grouped together to form groups based on their distance from the nearest isolation areas. In this way, memory cells program speed difference within the same group can be significantly reduced. However, a program speed difference between memory cells in different groups (within the same block) may still remain. Since all groups are connected to the same word line layer in one block (e.g., four word line fingers in a word line layer), a group with slower programming memory cells needs a higher final program voltage (higher magnitude voltage in last iteration of step 772 of FIG. 7B) to complete programming. This higher final program voltage may cause extra program disturb for erased memory cells (data state S0) in the groups of memory cells having faster programming memory cells. Because of this, the memory cell program speed difference in the various groups may have a negative impact for program disturb.

Figure 9:
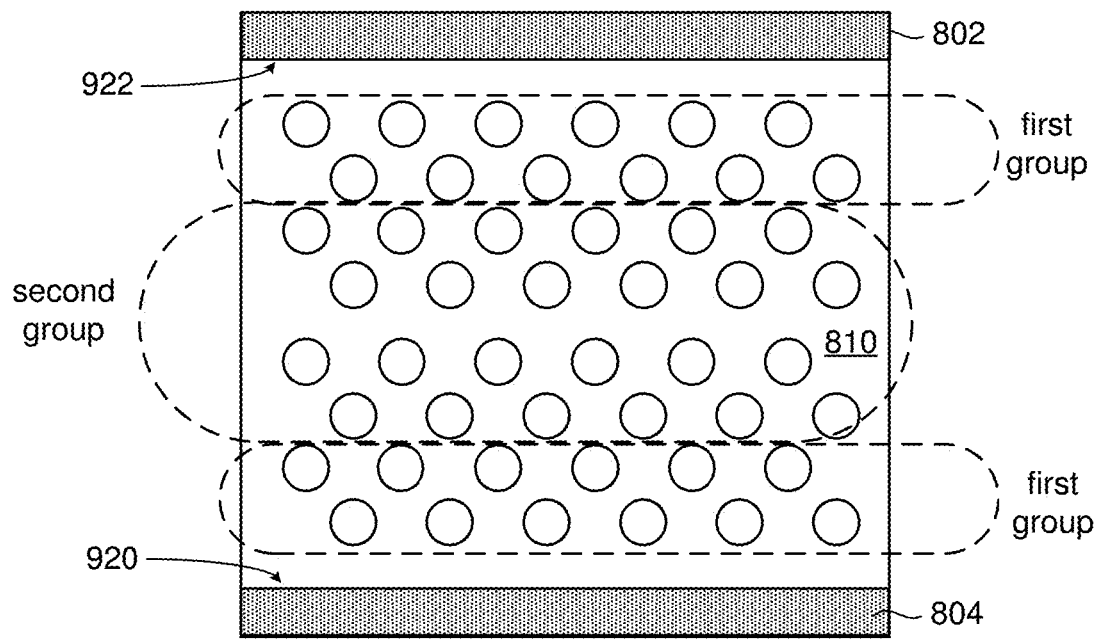
FIG. 9 depicts a top view of a portion of a block of memory cells.

As discussed above, memory holes can be grouped together to form groups based on their distance from the nearest isolation areas. Alternatively said, memory holes can be grouped together to form groups based on their distance from the edge of the word line layers. This is depicted in FIG. 9 which shows a portion of a block, including word line layer 810 between isolation area 802 and isolation area 804. Between the isolation areas 802 and 804 are eight rows of memory holes divided into two groups based on distance to the isolation areas 802/804 (also known as distance to the edge 922 or edge 920 of the word line layer 810). For example, a first group includes outer memory holes (and memory cells) closer to edge 922 or closer to edge 920 of the word line 810. A second group includes memory holes (and memory cells) that are further from edge 920 and edge 922 of word line layer 810.

The first group of memory holes and memory cells includes multiple adjacent rows of memory holes/memory cells between a pair of isolation areas 1002/1004. The second group of memory cells includes two or more adjacent rows of memory holes/memory cells between pairs of isolation areas. In some embodiments, memory holes can also be referred to as memory columns. More specifically, memory columns include all the materials described above with respect to FIG. 4E.

Figure 10:
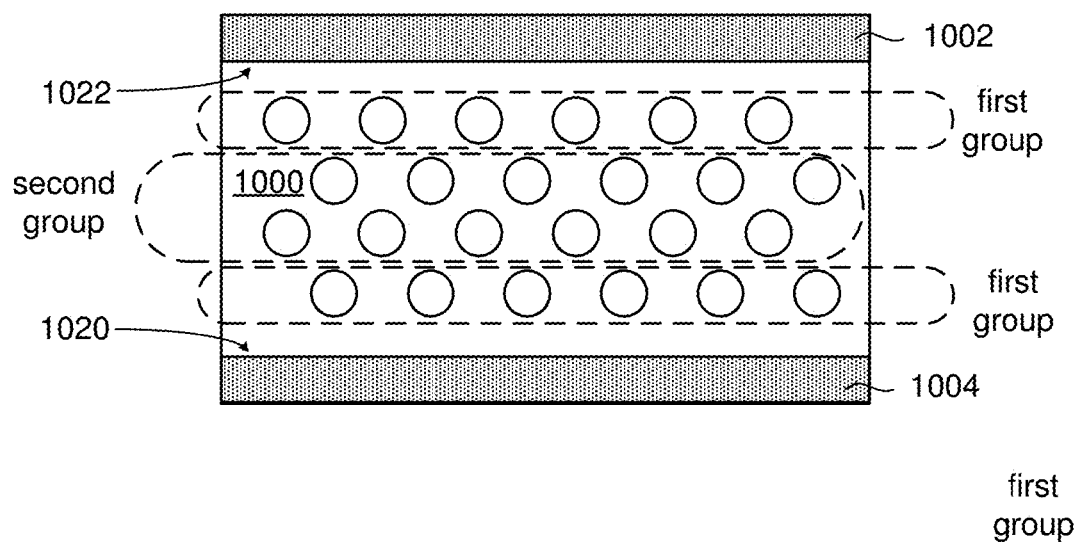
FIG. 10 depicts a top view of a portion of a block of memory cells.

FIG. 10 shows a portion of a block which includes word line layer 1000 between isolation layers 1002 and 1004. The portion of the block depicted in FIG. 10 includes four rows of memory holes between isolation areas 1002/1004. The memory holes are divided into a first group representing memory holes (and memory cells) closer to edges 1020 and 1022 of word line layer 1000 and a second group of memory holes (and memory cells) further from edges 1020 and 1022 of word line layer 1000.

Figure 11:
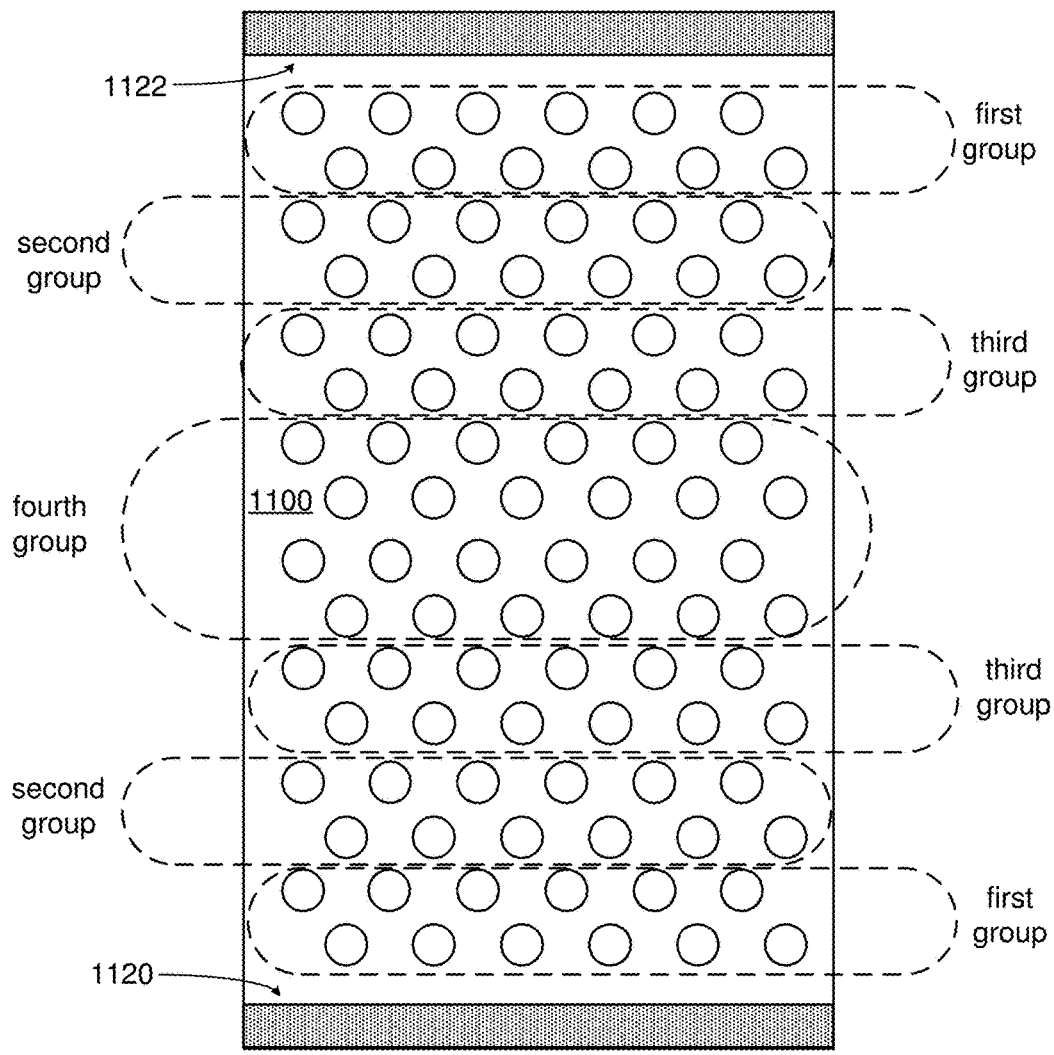
FIG. 11 depicts a top view of a portion of a block of memory cells.

FIG. 11 depicts a portion of a block which includes word line layer 1100 between isolation areas 1120/1122. The portion of the block depicted in FIG. 11 includes sixteen rows of memory holes between isolation areas 1120 and 1122 divided into four groups. The first group includes two rows of memory holes closest to edge of 1122 of word line layer 1100 and two memory holes closer to edge 1120 of word line layer 1100. The second group includes two rows of memory holes that are third and fourth from the edge 1120 of word line layer 1100 and rows of memory holes that are third and fourth from edge 1122 of word line layer 1100. The third group includes memory holes that are fifth and sixth from edge 1120 of word line layer 100 and two rows of memory holes that are fifth and sixth from edge 1122 of word line layer 1100. The fourth group includes four rows of memory holes that are furthest from edges 1120 and 1122. Therefore, embodiments of FIGS. 9-11 divide the rows of memory holes into groups based on distance from the edges of the word line layers.

When grouping rows of memory holes into groups within the same sub-block, rows of memory cells with similar programming speeds are placed into the same groups. In this way, memory cells on the same word line within the same group will have similar program speed. However, program speed differences for memory cells in different groups can be large, and this difference can cause program disturb for erased memory cells in the various groups that have faster programming speeds. To overcome this problem, that is to minimize variations in program speed and reduce program disturb, it is proposed that different verify reference voltages be used during the programming for different groups of memory cells. Memory cells in groups of faster programming memory cells will have the verified reference voltages set higher. Memory cells in groups of slower programming memory cells will have the verify reference voltages set lower.

In some memory systems, the programming include first programming memory cell to an intermediate verify voltage and then programming the memory cells to a final target (or final target level). Sometimes the intermediate voltage is called an offset voltage. The proposal discussed above in which different memory cells are programmed with different verified reference voltages based on whether they are in groups of fast programming memory cells closer to the isolation areas of slower programming memory cells further from the isolation areas pertains to changing the final target (final target level). The final target (final target levels) are adjusted. The faster programming memory cells and slower programming memory cells (e.g., the multiple groups) will complete programming on the same program pulse. In this way, slower programming memory cells will not cause program disturb on faster programming memory cells. Overall programming disturb inside a block will be improved as a result.

Figure 12:
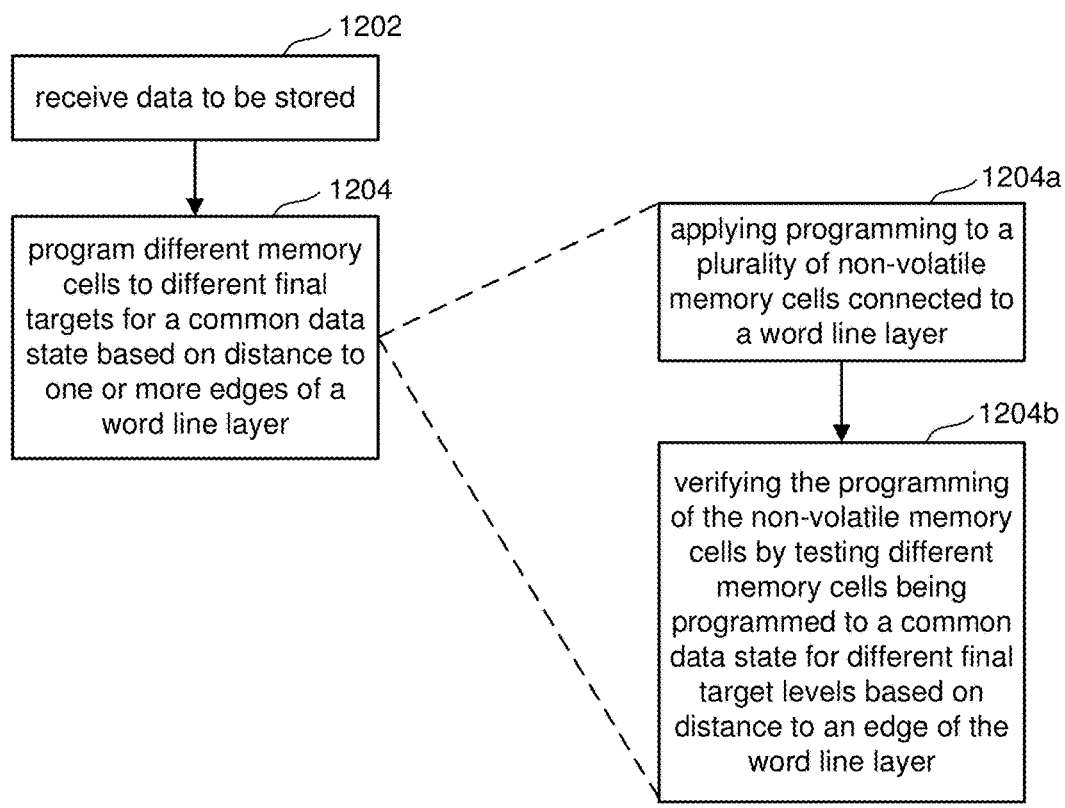
FIG. 12 is a flow chart describing one embodiment of a process for programming.

This proposal is described at a high level with respect to FIG. 12, which is a flow chart describing one embodiment of a process for programming In step 1202 of FIG. 12, data is received to be stored in the nonvolatile memory. In step 1204, the memory system will program different memory cells to different final targets for a common data state based on distance to one or more edge of the word line layer. The different final targets are verified reference voltages as discussed above. The common data state can be any one of data states S0-S7, discussed above. One example implementation of step 1204 includes applying programming to a plurality of nonvolatile memory cells connected to a word line layer (step 1204a) and verifying the program of the nonvolatile memory cells by testing different memory cells being programmed to the common data state for different final target levels based on the distance to one or more edge of the word line layer (step 1204b).

In some embodiments, an entire set of verified reference voltages are customized for each group of memory holes. In other embodiments, only verified reference voltages for a subset of one or more data states are adjusted.

Figure 13A:
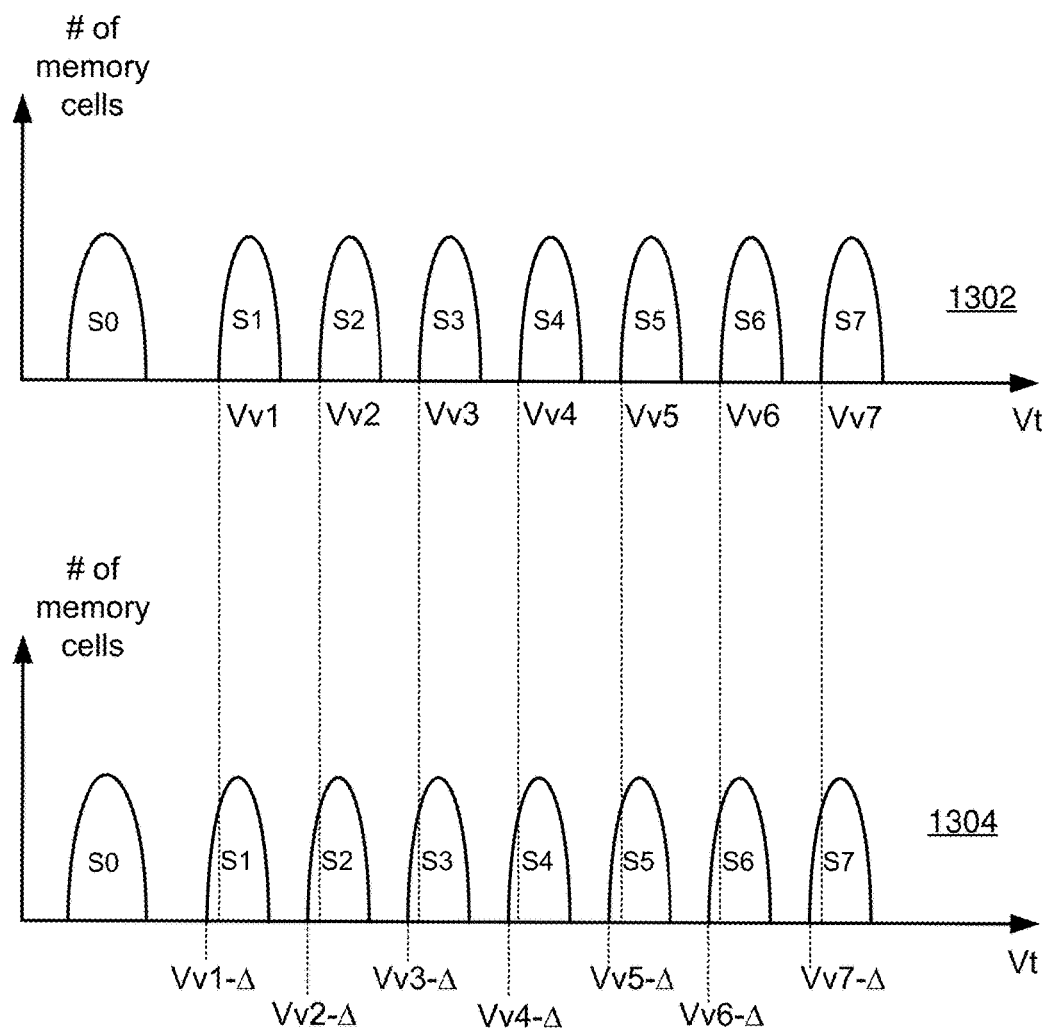
FIG. 13A depicts threshold voltage distributions.

As a result of this proposed use of different final target levels for different groups of memory cells, each group of memory cells will be programmed to slightly different threshold voltage distributions for the same data states. This is depicted in FIG. 13A, which applies to an embodiment that stores three bits of data per memory cell and has its memory holes within a sub block divided into two groups (see FIGS. 9 and 10). That is, the groups of memory holes or groups of memory cells comprise a first group of memory cells at a first range of one or more distances from one or more edges of the word line layer and a second group of memory cells that are at a second range of one or more distances from the one or more edges edge of the word line layer. There is a range of distances because, as seen in some of the figures described above, multiple rows of memory cells can be in a common group. The second range of distances, in this example, are greater than the first range of distances. The control circuit is configured to program the first group of memory cells using the first set of target levels for first set of data states and program the second group of memory cells, at a separate time from the first group, using a second set of target levels for the same set of data states. The first set of target levels are each higher in voltage than corresponding target levels of the second set of target levels such that on completion of programming, the first group of memory cells are in a first set of threshold voltage distributions 1302 of FIG. 13A and the second group of memory cells are in a second set of threshold voltage distributions 1304 that are each at a lower voltage than the corresponding threshold voltage distributions in the first set of voltage distribution 1302. For example, S1 of distributions 1304 begins at a lower voltage than S1 of distributions 1302. That is because the final target level (verify reference voltage) used to program memory cells of the first group to S1 was Vv1 and the final target level (verify reference voltage) used to program memory cells of the second group to S1 was Vv1-4. Since the second set of memory cells being programmed to distributions 1304 use lower verify levels each of the corresponding data states start at a lower voltage level. In the above discussion, the first set of target levels includes Vv1, Vv2, Vv3, Vv4, Vv5, Vv6, and Vv7. The second set of target levels includes Vv1-Δ, Vv2-Δ, Vv3-Δ, Vv4-Δ, Vv5-Δ, Vv6-Δ, and Vv7-Δ.

Figure 13B:
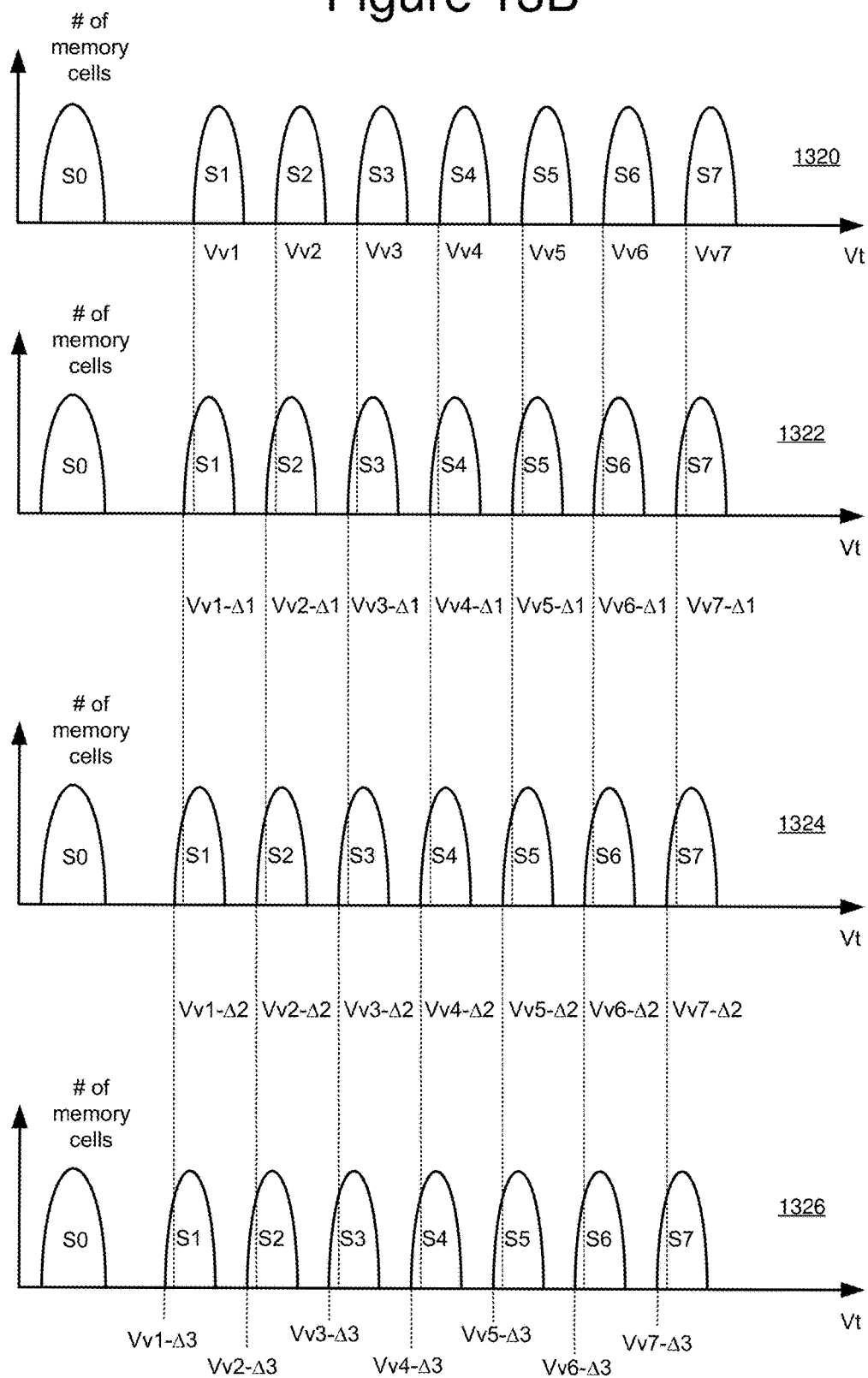
FIG. 13B depicts threshold voltage distributions.

FIG. 13B shows threshold distributions for a system that includes four groups of memory holes/cells between isolation areas, which is depicted graphically in FIG. 11. In the embodiment of FIGS. 11 and 13B, the first group of memory cells are programmed to the common data states using a first set of target levels, the second group of memory cells are programmed to the common data states using a second set of target levels, the third group of memory cells are programmed to the common data states using a third set of target levels, and the fourth group of memory cells are programmed to the common data states using a fourth set of target levels. The first set of target levels includes Vv1, Vv2, Vv3, Vv4, Vv5, Vv6, and Vv7. The second set of target levels includes Vv1-Δ1, Vv2-Δ1, Vv3-Δ1, Vv4-Δ1, Vv5-Δ1, Vv6-Δ1, and Vv7-Δ1. The third set of target levels includes Vv1-Δ2, Vv2-Δ2, Vv3-Δ2, Vv4-Δ2, Vv5-Δ2, Vv6-Δ2, and Vv7-Δ2. The fourth set of target levels includes Vv1-Δ3, Vv2-Δ3, Vv3-Δ3, Vv4-Δ3, Vv5-Δ3, Vv6-Δ3, and Vv7-Δ3. As a result of programming the first group of memory cells using the first set of target levels, the memory cells are programmed to threshold voltage distributions 1320. The result of programming the second group of memory cells using the second set of target levels results in memory cells being programmed to threshold voltage distributions 1322. The result of programming the memory cells of the third group using the third set of target levels is the memory cells being programmed to threshold voltage distributions 1324. The result of programming the memory cells of the fourth group of memory cells using the fourth set of target levels is the memory cells being programmed to threshold voltage distributions 1326.

Threshold voltage distributions 1326 that are each at a lower voltage than the corresponding threshold voltage distributions in threshold voltage distributions 1324. Threshold voltage distributions 1324 that are each at a lower voltage than the corresponding threshold voltage distributions in threshold voltage distributions 1322. Threshold voltage distributions 1322 that are each at a lower voltage than the corresponding threshold voltage distributions in threshold voltage distributions 1320.

In one embodiment, Δ or Δ1 can be 0.1 v, 0.2 v, or another small amount of voltage. In some embodiments, Δ2 is an offset that is greater than Δ1 by 0.1 v, 0.2 v, or some other small voltage. In one embodiment, Δ3 is an offset that is greater than Δ2 by 0.1 v, 0.2 v, or some other small voltage. Thus, applying the process of FIG. 12 to the memory cells or the memory holes depicted in FIG. 9 or 10 result in the threshold voltage distributions 1302 and 1304 of FIG. 13A. Performing the process of FIG. 12 on memory cells of the memory holes depicted in FIG. 11 results in threshold distributions 1320, 1322, 1324 and 1326 of FIG. 13B.

Figure 14:
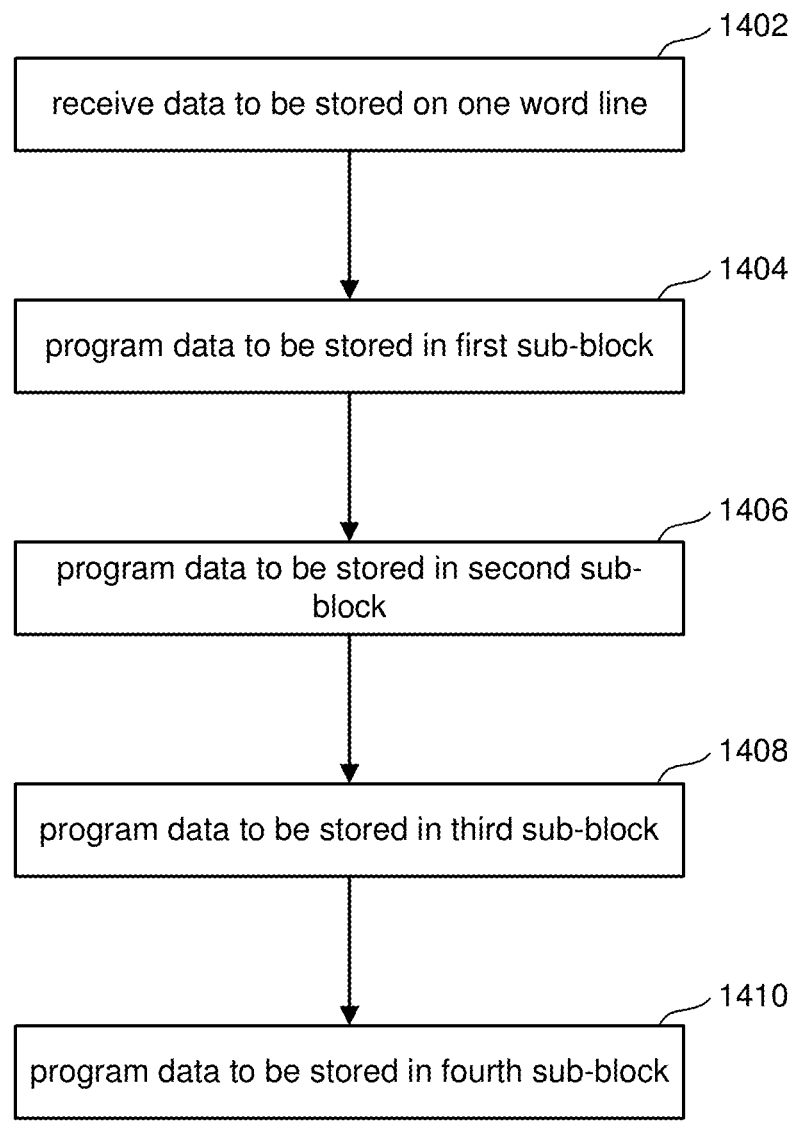
FIG. 14 is a flow chart describing one embodiment of a process for programming.

FIG. 14 is a flow chart describing more details of one example implementation of the process of FIG. 12. The process of FIG. 14 is used to program data for the plurality of memory cells connected to a common word line. In step 1402, data is received. That data is to be stored in memory cells connected to one word line. In one example, the word line is connected to four sub-blocks, as described above. In step 1404, the system programs data to be stored in a first sub block. In step 1406, the system programs data to be stored in a second sub block. In step 1408, the system programs data to be stored in a third sub block. In step 1410, the system programs data to be stored in a fourth sub block. In one embodiment the four sub-blocks of step 1404-1410 correspond to the four sub-blocks SB0, SB1, SB2 and SB3 described above.

Figures 15, 16:
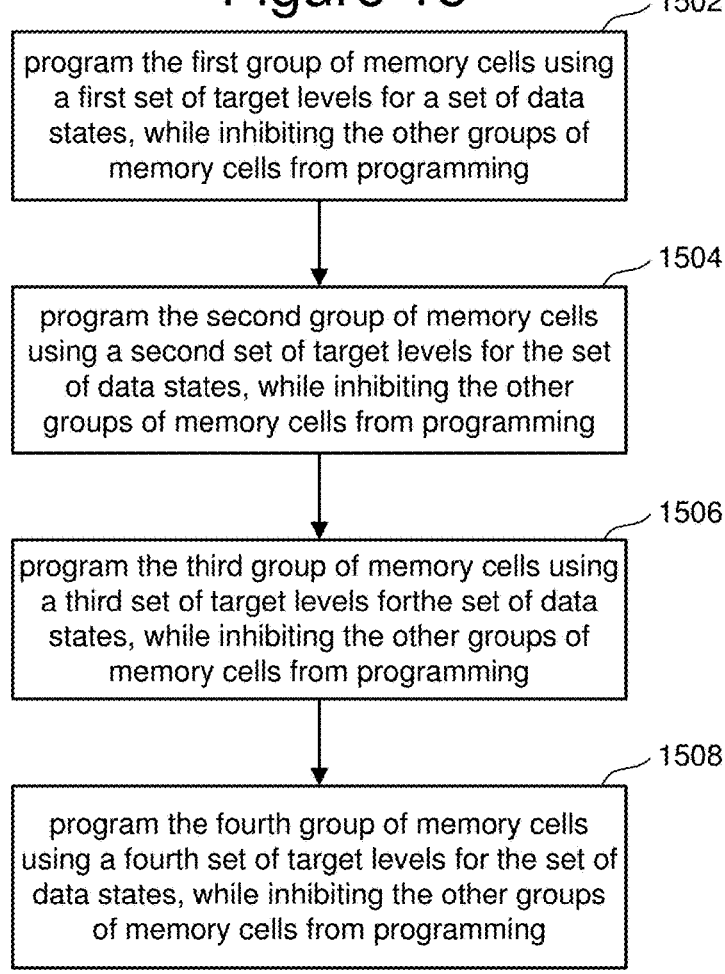
FIG. 15 is a flow chart describing one embodiment of a process for programming a sub-block.
FIG. 16 is a table providing verify voltages for different groups of memory cells in a sub-block.

FIG. 15 is a flow chart describing one example implementation of programming data to be stored in a sub-block. That is, the process of FIG. 15 can be used to implement any of steps 1404, 1406, 1408 and 1410. The process of FIG. 15 applies to an embodiment which divides the memory holes/memory cells of a sub block into four groups such as depicted in FIG. 11. The first group of memory cells are at a first range of one or more distances from one or more edges of the word line layer. The second group of memory cells are at a second range of one or more distances from one or more edges of the word line layer. The third group of memory cells are at a third range of one or more distances from one or more edges of the word line layer. The fourth group of memory cells are at a fourth range of one or more distances from one or more edges of the word line layer. The process of FIG. 15 can be adapted for embodiments that use more or less than four groups.

In step 1502 of FIG. 15, the system programs the first group of memory cells using a first set of target levels for a set data states, while inhibiting the other groups of memory cells from being programmed. Step 1502 includes performing the process of FIG. 7B. In step 1504, the system programs the second group of memory cells using a second set of target levels for the set of data states while inhibiting the other groups of memory cells from programming. Step 1504 includes performing the process of FIG. 7B. In step 1506, the system programs the third group of memory cells using a third set of target levels for the set of data states while inhibiting the other groups of memory cells from programming. Step 1506 includes performing the process of FIG. 7B. In step 1508, the system programs the fourth group of memory cells using a fourth set of target levels for the set of data states while inhibiting the other groups of memory cells from programming. Step 1508 includes performing the process of FIG. 7B.

FIG. 16 is a table which depicts the first set of target levels for the first group, the second set of target levels for the second group, the third set of target levels for the third group and the fourth set of target levels for the fourth group. Each of the target levels of FIG. 16 correspond to the final target levels and threshold voltage distributions depicted in FIG. 13B. In one embodiment, each of steps 1502-1508 complete programming for the different memory cells on the same number of programming voltage pulses.

The above discussion of FIG. 15 includes using different sets of target levels for each group. Each set of target levels includes separate final target levels for each data state. In some embodiments, the variation in target levels between groups can be implemented for a subset of data states (one data state, two data states, . . . ).

The discussion above includes a means for programming memory cells closer to one or more edges of the word line layer and memory cells further from one or more edges of the word line layer to a first data state representing first data such that the memory cells closer to an edge of the word line layer are programmed to a first final threshold voltage distribution using a first final verified level and memory cells further from the edges of the word line layer are programmed to a second final threshold voltage distribution using a second verified level. In this embodiment, the second verified level is lower than the first verified level and the second threshold voltage distribution is lower in voltage than the first threshold voltage distribution. The means for programming can include the various circuits depicted in FIG. 1. In some embodiments, the means for programming can also include the circuits depicted in FIG. 2. These circuits use the processes of FIG. 7A, 7B and FIG. 12 to perform the programming. Additionally, FIGS. 14 and 15 provide example implementations of FIG. 12.

One embodiment includes a non-volatile storage apparatus comprising a memory structure comprising a word line layer and a plurality of non-volatile memory cells, and a control circuit connected to the memory structure. The control circuit is configured to program different memory cells to different final targets for a common data state based on distance to one or more edges of a word line layer.

In one example implementation, the memory structure is a monolithic three dimensional memory structure that further comprises a plurality of dielectric layers, a plurality of memory columns and plurality of isolation areas, the word line layers are arranged alternatingly with the plurality of dielectric layers forming a stack, the memory columns extend vertically through at least a portion of the stack, the non-volatile memory cells include portions of the memory columns, edges of the word line layers are adjacent to the isolation areas, memory cells closer to the isolation areas are faster programming memory cells, and memory cells further from the isolation areas are slower programming memory cells.

One embodiment includes a non-volatile storage apparatus comprising a first word line layer, a plurality of non-volatile memory cells comprising a first group of memory cells at a first range of one or more distances from one or more edges of the first word line layer and a second group of memory cells at a second range of one or more distances from the one or more edges of the first word line layer (the second range of distances are greater than the first range of distances), and a control circuit in communication with the memory cells and the first word line layer. The control circuit is configured to program the first group of memory cells using a first target level for a first data state. The control circuit is configured to program the second group of memory cells using a second target level for the first data state. The first target level is higher in voltage than the second target level such that on completion of programming the first group of memory cells are in a first threshold voltage distribution and the second group of memory cells are in a second threshold voltage distribution that is lower in voltage than the first threshold voltage distribution.

One embodiment includes a method for programming non-volatile memory comprising applying programming to a plurality of non-volatile memory cells connected to a word line layer and verifying the programming of the non-volatile memory cells by testing different memory cells being programmed to a common data state for different final target levels based on distance to one or more edges of the word line layer.

One embodiment includes a non-volatile storage apparatus comprising a word line layer; a plurality of non-volatile memory cells; and means for programming memory cells closer to one or more edges of the word line layer and memory cells further from the one or more edges of the word line layer to a first data state representing first data such that the memory cells closer to an edge of the word line layer are programmed to a first final threshold voltage distribution using a first final verify level and the memory cells further from the one or more edges of the word line layer are programmed to a second final threshold voltage distribution using a second verify level. The second verify level is lower than the first verify level. The second final threshold voltage distribution is lower in voltage than the first threshold voltage distribution.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a memory structure comprising a word line layer and a plurality of non-volatile memory cells; and
   a control circuit connected to the memory structure, the control circuit is configured to program different memory cells to different final targets for a common data state based on distance to one or more edges of a word line layer.

2. The non-volatile storage apparatus of claim 1, wherein:
   the control circuit is configured to program the different memory cells to different final targets for the common data state to result in memory cells at a first range of one or more distances from the one or more edges of the word line layer being in a first threshold voltage distribution and memory cells at a second range of one or more distances from the one or more edges of the word line layer being in a second threshold voltage distribution that is offset from the first threshold voltage distribution.

3. The non-volatile storage apparatus of claim 1, wherein:
   the control circuit is configured to program the different memory cells by applying a set of program voltage pulses and performing verification using the different final targets between program voltage pulses; and
   the control circuit is configured to complete programming of the different memory cells on a same number of program voltage pulse.

4. The non-volatile storage apparatus of claim 1, wherein:
   the control circuit is configured to program faster programming memory cells and slower programming memory cells to the common data state such that the faster programming memory cells are programmed to a first threshold voltage distribution and the slower programming memory cells are programmed to a second threshold voltage distribution that is lower in voltage than the first threshold voltage distribution; and
   the slower programming memory cells are positioned further from the one or more edges of a word line layer than the faster programming memory cells.

5. The non-volatile storage apparatus of claim 1, wherein:
the plurality of non-volatile memory cells comprise a first group of memory cells at a first range of one or more distances from the one or more edges of the word line layer and a second group of memory cells at a second range of one or more distances from the one or more edges of the word line layer, the second range of distances are greater than the first range of distances;
the control circuit is configured to program the first group of memory cells using a first set of target levels for a set of data states;
the control circuit is configured to program the second group of memory cells using a second set of target level for the set of data states;
the first set of target levels are each higher in voltage than corresponding target levels in the second set of target levels such that on completion of programming the first group of memory cells are in a first set of threshold voltage distributions and the second group of memory cells are in a second set of threshold voltage distributions that are each lower in voltage than corresponding threshold voltage distributions in the first set of threshold voltage distributions.

6. The non-volatile storage apparatus of claim 1, wherein:
the memory structure is a monolithic three dimensional memory structure that further comprises a plurality of dielectric layers, a plurality of memory columns and plurality of isolation areas;
the word line layers are arranged alternatingly with the plurality of dielectric layers forming a stack;
the memory columns extend vertically through at least a portion of the stack, the non-volatile memory cells include portions of the memory columns;
edges of the word line layers are adjacent to the isolation areas;
memory cells closer to the isolation areas are faster programming memory cells; and
memory cells further from the isolation areas are slower programming memory cells.

7. The non-volatile storage apparatus of claim 6, wherein:
the memory cells each include a dielectric layer;
the memory cells closer to the isolation areas have thinner dielectric layers; and
the memory cells further from the isolation areas have thicker dielectric layers.

8. The non-volatile storage apparatus of claim 6, wherein:
the memory structure includes multiple rows of memory columns between pairs of isolation areas;
the memory columns are grouped into multiple rows of memory columns per group; and
the control circuit is configured to program different memory cells to different final targets for the common data state by using different sets of final targets for the common data state for different groups.

9. The non-volatile storage apparatus of claim 8, wherein:
the groups comprise a first group of memory cells at a first range of one or more distances from the one or more edges of the word line layer and a second group of memory cells at a second range of one or more distances from the one or more edges of the word line layer, the second range of distances are greater than the first range of distances;
the control circuit is configured to program the first group of memory cells using a first set of target levels for a set of data states;
the control circuit is configured to program the second group of memory cells, at separate time from the first group, using a second set of target levels for the set of data states;
the first set of target levels are each higher in voltage than corresponding target levels in the second set of target levels such that on completion of programming the first group of memory cells are in a first set of threshold voltage distributions and the second group of memory cells are in a second set of threshold voltage distributions that are each lower in voltage than corresponding threshold voltage distributions in the first set of threshold voltage distributions.

\* \* \* \* \*